(12) United States Patent
Ma et al.

(10) Patent No.: US 12,262,556 B2
(45) Date of Patent: Mar. 25, 2025

(54) POWER AMPLIFIER

(71) Applicant: Murata Manufacturing Co., Ltd., Kyoto-fu (JP)

(72) Inventors: Shaojun Ma, Nagaokakyo (JP); Shigeki Koya, Nagaokakyo (JP); Masayuki Aoike, Nagaokakyo (JP); Shinnosuke Takahashi, Nagaokakyo (JP); Yasunari Umemoto, Nagaokakyo (JP); Masatoshi Hase, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/549,566

(22) Filed: Dec. 13, 2021

(65) Prior Publication Data
US 2022/0190124 A1    Jun. 16, 2022

(30) Foreign Application Priority Data
Dec. 15, 2020 (JP) ................... 2020-207804

(51) Int. Cl.
| *H01L 29/737* | (2006.01) |
| *H01L 29/423* | (2006.01) |
| *H03F 3/217* | (2006.01) |
| *H10D 10/80* | (2025.01) |
| *H10D 64/00* | (2025.01) |
| *H10D 64/23* | (2025.01) |

(Continued)

(52) U.S. Cl.
CPC ........... H10D 64/118 (2025.01); H03F 3/217 (2013.01); H10D 10/821 (2025.01); H10D 64/231 (2025.01); H10D 64/281 (2025.01); H10D 64/60 (2025.01)

(58) Field of Classification Search
CPC ........ H01L 29/41708; H01L 29/42304; H01L 29/7327; H01L 29/1004; H01L 29/732; H01L 29/7371
See application file for complete search history.

(56) References Cited

U.S. PATENT DOCUMENTS 10,158,030 B2    12/2018  Gu et al.
2003/0213973 A1*  11/2003  Yoshioka ............ H01L 29/7371
                                                257/E29.189

(Continued)

FOREIGN PATENT DOCUMENTS

| CN | 109659286 A | 4/2019 |
| JP | 2006-186235 A | 7/2006 |

(Continued)

*Primary Examiner* — Donald H B Braswell
*Assistant Examiner* — John Lin
(74) *Attorney, Agent, or Firm* — Studebaker Brackett PLLC

(57) ABSTRACT

A power amplifier that includes a substrate, and an emitter layer, a base layer, and a collector layer laminated in this order on a major surface of the substrate includes an electrical insulator provided adjacent to the emitter layer, an emitter electrode provided between the substrate and both the emitter layer and the electrical insulator, a base electrode electrically connected to the base layer, and a collector electrode electrically connected to the collector layer. The emitter electrode, the electrical insulator, and the base layer are provided between the substrate and the base electrode in a direction perpendicular to the major surface of the substrate.

9 Claims, 13 Drawing Sheets

(51) Int. Cl.
  *H10D 64/27* (2025.01)
  *H10D 64/60* (2025.01)

(56) References Cited

U.S. PATENT DOCUMENTS

| | | | | |
|---|---|---|---|---|
| 2004/0212034 | A1* | 10/2004 | Mochizuki | H01L 29/42304 |
| | | | | 257/E29.189 |
| 2005/0285130 | A1* | 12/2005 | Hsieh | H01L 33/64 |
| | | | | 438/46 |
| 2006/0138458 | A1 | 6/2006 | Tanaka et al. | |
| 2014/0231876 | A1 | 8/2014 | Tsai et al. | |
| 2019/0172806 | A1* | 6/2019 | Kurokawa | H01L 29/42316 |
| 2020/0328293 | A1* | 10/2020 | Tao | H01L 29/66242 |
| 2021/0028130 | A1* | 1/2021 | Ida | H01L 21/02 |
| 2021/0098600 | A1* | 4/2021 | Dutta | H01L 24/00 |

FOREIGN PATENT DOCUMENTS

| | | |
|---|---|---|
| JP | 2019-220669 A | 12/2019 |
| KR | 10-0641055 B1 | 11/2006 |
| TW | 201351570 A | 12/2013 |
| WO | 2019/208294 A1 | 10/2019 |

\* cited by examiner

POWER AMPLIFIER

CROSS-REFERENCE TO RELATED APPLICATION

This application claims benefit of priority to Japanese Patent Application No. 2020-207804, filed Dec. 15, 2020, the entire content of which is incorporated herein by reference.

BACKGROUND

Technical Field

The present disclosure relates to a power amplifier.

Background Art

A heterojunction bipolar transistor (HBT) is used in an amplifier circuit for a radio-frequency signal. U.S. Pat. No. 10,158,030 describes a configuration in which an HBT is provided above a substrate on which a CMOS device is formed. The HBT described in U.S. Pat. No. 10,158,030 is laminated above the substrate in order of an emitter layer, a base layer, and a collector layer.

SUMMARY

In the HBT described in U.S. Pat. No. 10,158,030, an emitter electrode and an emitter wire connected to the emitter layer and a base electrode and a base wire connected to the base layer are extended from the same side. The emitter wire and the base wire are close to each other. Therefore, there is a possibility that a parasitic capacitance formed between an emitter and a base increases.

Accordingly, the present disclosure provides a power amplifier capable of reducing a parasitic capacitance formed between an emitter and a base.

According to preferred embodiments of the present disclosure, a power amplifier that includes a substrate, and an emitter layer, a base layer, and a collector layer laminated in this order on a major surface of the substrate includes an electrical insulator provided adjacent to the emitter layer, an emitter electrode provided between the substrate and both the emitter layer and the electrical insulator, a base electrode electrically connected to the base layer, and a collector electrode electrically connected to the collector layer. The emitter electrode, the electrical insulator, and the base layer are provided between the substrate and the base electrode in a direction perpendicular to the major surface of the substrate.

According to an aspect of the present disclosure, a power amplifier that includes a substrate, and an emitter layer, a base layer, and a collector layer laminated in this order on a major surface of the substrate includes an electrical insulator provided adjacent to the emitter layer, a through-hole provided in a region of the substrate, the region overlapping the emitter layer, an emitter electrode provided in the through-hole and electrically connected to the emitter layer, a base electrode electrically connected to the base layer, and a collector electrode electrically connected to the collector layer. The electrical insulator and the base layer are provided between the substrate and the base electrode in a direction perpendicular to the major surface of the substrate.

DETAILED DESCRIPTION

Hereinafter, embodiments of the present disclosure will be described in detail with reference to the accompanying drawings. The present disclosure is not limited to the embodiments. The embodiments are illustrative, and, of course, partial replacements or combinations of components described in different embodiments are possible. In the second and following embodiments, the description of similar matters to those of the first embodiment is omitted, and only the differences will be described. Particularly, similar operation and advantageous effects with similar components will not be repeated one by one for each embodiment.

First Embodiment

Figure 1:
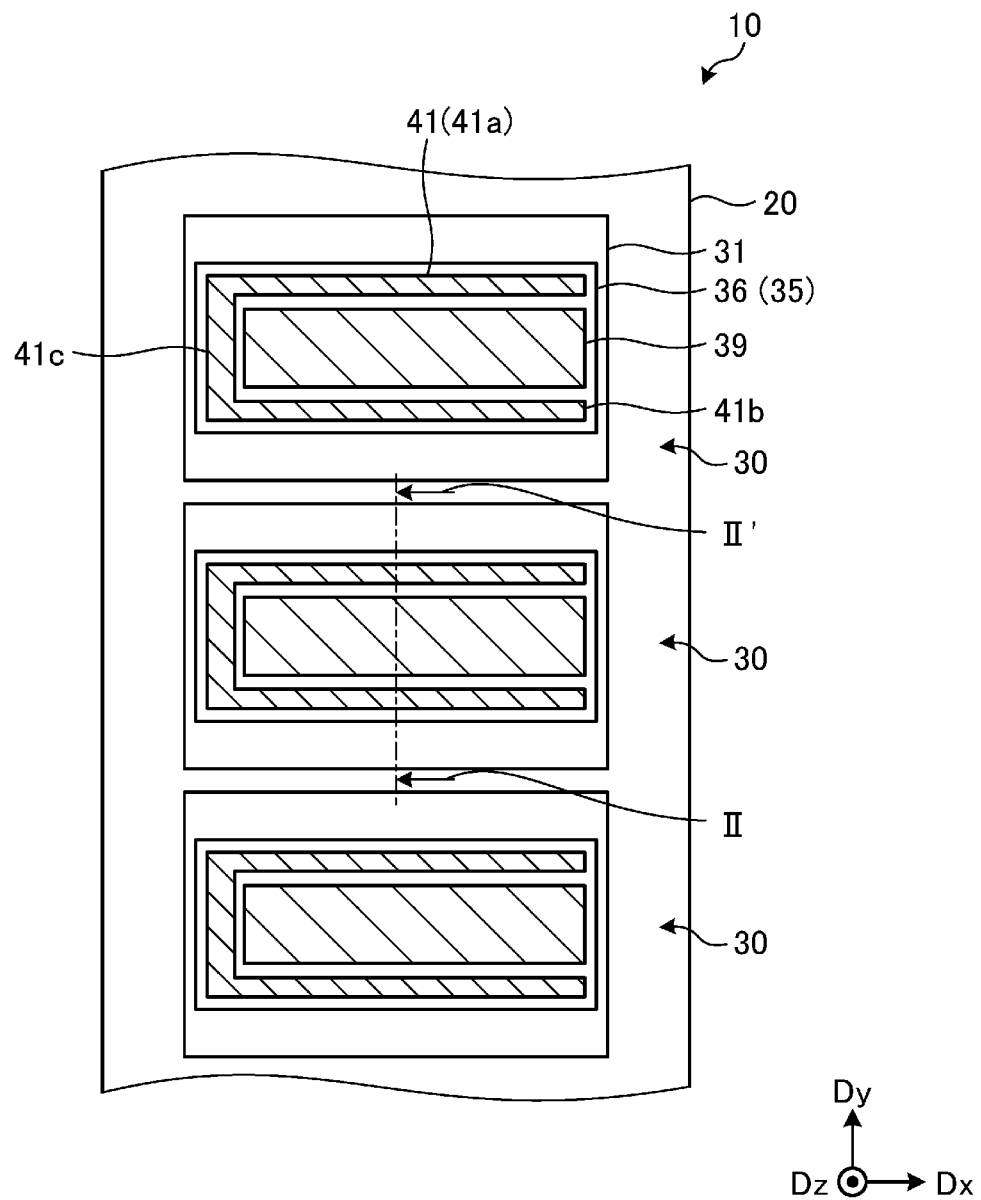
FIG. 1 is a plan view schematically showing a power amplifier according to a first embodiment.

FIG. 1 is a plan view schematically showing a power amplifier according to the first embodiment. FIG. 1 does not show various wires including a collector wire 40, emitter wires 42, and the like for the purpose of easy understanding of an arrangement relationship among electrodes. In FIG. 1, a base electrode 41 and a collector electrode 39 are hatched.

In the following description, directions parallel to the major surface of a substrate 20 are defined as a first direction Dx and a second direction Dy. The first direction Dx is a direction orthogonal to the second direction Dy. A direction orthogonal to the first direction Dx and the second direction Dy is defined as a third direction Dz. The third direction Dz is a direction perpendicular to the major surface of the substrate 20. A plan view shows an arrangement relationship when viewed in the third direction Dz.

As shown in FIG. 1, the power amplifier 10 includes the substrate 20 and a plurality of transistors 30. The plurality of transistors 30 is provided on the major surface of the substrate 20 and arranged in the second direction Dy. Each of the plurality of transistors 30 includes an emitter electrode 31, the base electrode 41, and the collector electrode 39.

In plan view, the emitter electrode 31 has a greater area than the base electrode 41 or the collector electrode 39. The base electrode 41 and the collector electrode 39 are provided so as to overlap the emitter electrode 31. The collector electrode 39 has a rectangular shape that is long in the first direction Dx in plan view.

The base electrode 41 has a substantially U-shape and disposed side by side with the collector electrode 39 in plan view. Specifically, the base electrode 41 has two main portions 41a, 41b and a connection portion 41c connecting the main portions 41a, 41b. The two main portions 41a, 41b each extend in the first direction Dx. The collector electrode 39 is provided between the main portion 41a and the main portion 41b that are side-by-side in the second direction Dy. The connection portion 41c is provided side by side with a short side of the collector electrode 39 in the first direction Dx and connects end portions of the main portions 41a, 41b on the same side.

The configurations of the emitter electrode 31, the base electrode 41, and the collector electrode 39 are only one examples and may be modified as needed. For example, the base electrode 41 does not need to have the connection portion 41c. The emitter electrode 31 is provided separately in each of the plurality of transistors 30; however, the configuration is not limited thereto. One emitter electrode 31 may be shared among the plurality of transistors 30.

Figure 2:
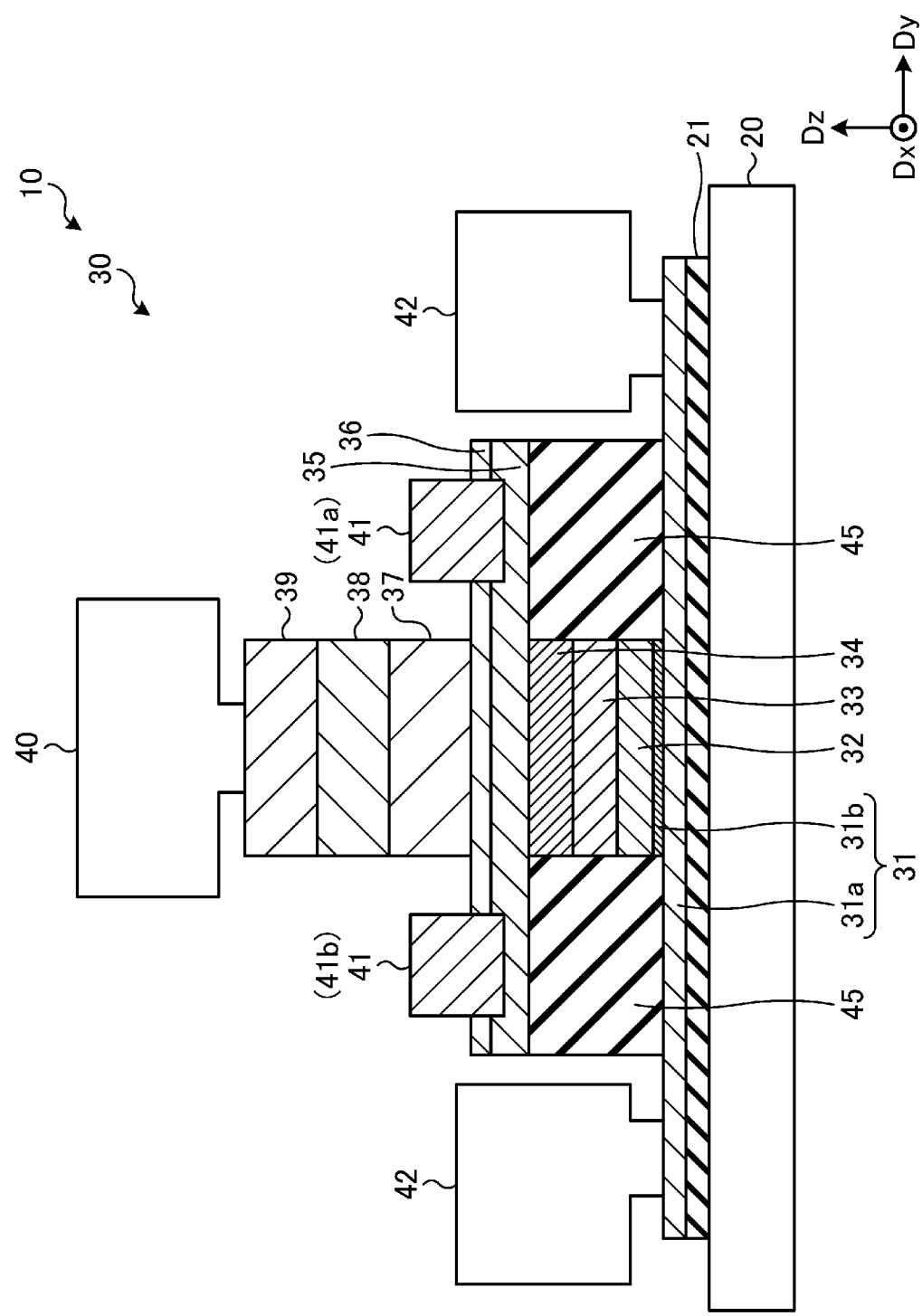
FIG. 2 is a cross-sectional view taken along the line II-II' in FIG. 1.

FIG. 2 is a cross-sectional view taken along the line II-II' in FIG. 1. Although FIG. 2 shows one of the transistors 30, the description of the transistor 30 shown in FIG. 2 also applies to the others of the plurality of transistors 30. In the following description, in the direction perpendicular to the major surface of the substrate 20, a direction from the substrate 20 toward the collector wire 40 is defined as "upper side" or simply "upper". A direction from the collector wire 40 toward the substrate 20 is defined as "lower side" or simply "lower".

As shown in FIG. 2, the transistor 30 is provided on the upper side of the major surface of the substrate 20. The substrate 20 includes a surface layer portion made of a semiconductor. The semiconductor may be based on an elemental semiconductor, for example, a silicon-based semiconductor element or a germanium-based semiconductor element. For example, a silicon (Si) substrate, a silicon-on-insulator (SOI) substrate, a gallium arsenide (GaAs) substrate, or the like may be used as the substrate 20.

A substrate-side electrically insulating layer 21 is provided on the major surface of the substrate 20. For example, SIO, SiN, polyimide, or the like may be used as the material of the substrate-side electrically insulating layer 21.

The transistor 30 is, for example, a heterojunction bipolar transistor (HBT). The transistor 30 is provided on the substrate-side electrically insulating layer 21. The transistor 30 has an emitter layer 34, a base layer 35, and a collector layer 37 laminated in this order from the major surface side of the substrate 20.

The emitter layer 34 is made of n-type InGaP. The base layer 35 is made of p-type GaAs. The collector layer 37 is made of n-type GaAs. These semiconductor layers may be made of another compound semiconductor, such as InP, GaN, SiGe, and SiC.

More specifically, the transistor 30 is laminated in order of the emitter electrode 31, a contact layer 32, a cap layer 33, the emitter layer 34, the base layer 35, an etching stop layer 36, the collector layer 37, a sub-collector layer 38, the collector electrode 39, and the collector wire 40 on the upper side of the major surface of the substrate 20. Furthermore, the transistor 30 includes electrical insulators 45, the base electrode 41 electrically connected to the base layer 35, and the emitter wires 42 electrically connected to the emitter electrode 31.

The emitter electrode 31 has a first portion 31a provided on the substrate-side electrically insulating layer 21, and a second portion 31b provided on the first portion 31a. The width of the second portion 31b in the second direction Dy is less than the width of the first portion 31a in the second direction Dy. The width of the second portion 31b in the second direction Dy is equal to the width of each of the contact layer 32, the cap layer 33, and the emitter layer 34 in the second direction Dy, laminated on the emitter electrode 31. The emitter electrode 31 is integrally formed by joining the first portion 31a formed on the substrate 20 to the second portion 31b formed on a motherboard 100 (see FIG. 3).

The contact layer 32, the cap layer 33, and the emitter layer 34 are laminated in this order on the second portion 31b of the emitter electrode 31. The electrical insulators 45 are provided on the first portion 31a of the emitter electrode 31 and are provided adjacent in the second direction Dy to the second portion 31b, the contact layer 32, the cap layer 33, and the emitter layer 34. More specifically, the second portion 31b, the contact layer 32, the cap layer 33, and the emitter layer 34 are sandwiched between the two electrical insulators 45 in the second direction Dy. The height of the electrical insulators 45 is equal to the height of the total of the second portion 31b, the contact layer 32, the cap layer 33, and the emitter layer 34. A material having a low dielectric constant is preferable as the electrical insulators 45 for the purpose of reducing a parasitic capacitance between a base and an emitter. For example, SIO, polyimide, or the like is used. The dielectric constant of the electrical insulators 45 is lower than the dielectric constant of the emitter layer 34. The dielectric constant of the electrical insulators 45 is, for example, lower than or equal to about seven. The dielectric constant of the emitter layer 34 is, for example, about 12.9.

The base layer 35 is provided on the electrical insulators 45 and the emitter layer 34. In other words, the width of the base layer 35 in the second direction Dy is greater than the width of the emitter layer 34 in the second direction Dy. The electrical insulators 45 are provided between the substrate 20 and the base layer 35 in the third direction Dz. The emitter electrode 31 is provided between the substrate 20 and both the electrical insulators 45 and the emitter layer 34.

The etching stop layer 36 is provided on the base layer 35. The etching stop layer 36 is provided over the entire top surface of the base layer 35. The etching stop layer 36 is made of a material different from that of the base layer 35 and is made of, for example, InGaP, AlAs, or the like. In the specification, the "top surface" is a surface oriented toward the upper side, that is, a direction from the substrate 20 toward the collector wire 40, and the "bottom surface" is a surface oriented toward the lower side, that is, a direction from the collector wire 40 toward the substrate 20, in the direction perpendicular to the major surface of the substrate 20.

The collector layer 37, the sub-collector layer 38, and the collector electrode 39 are laminated in this order on the etching stop layer 36. The width of each of the collector layer 37, the sub-collector layer 38, and the collector electrode 39 in the second direction Dy is less than the width of the base layer 35 in the second direction Dy. In other words, the base layer 35 has an overlap region in which the collector layer 37, the sub-collector layer 38, and the collector electrode 39 are provided, and a non-overlap region in which the collector layer 37, the sub-collector layer 38, and the collector electrode 39 are not provided.

The collector layer 37, the sub-collector layer 38, and the collector electrode 39 are provided in a region that overlaps the emitter layer 34. The width of each of the collector layer 37, the sub-collector layer 38, and the collector electrode 39 in the second direction Dy is equal to or wider than the width of the emitter layer 34 in the second direction Dy.

The base electrode 41 is provided in the non-overlap region on the top surface of the base layer 35. The base electrode 41 is provided on the surface of the base layer 35 on the same side as the surface on which the collector layer 37 is provided. The electrical insulators 45 and the base layer 35 are provided between the emitter electrode 31 and the base electrode 41 in the third direction Dz.

The collector wire 40 is provided on the collector electrode 39 and is electrically connected to the collector electrode 39. The emitter wires 42 are provided on the first portion 31a of the emitter electrode 31 and are electrically connected to the emitter electrode 31. Each of the emitter wires 42 is disposed side by side with the electrical insulator 45 and the base layer 35 in the second direction Dy.

Figure 3:
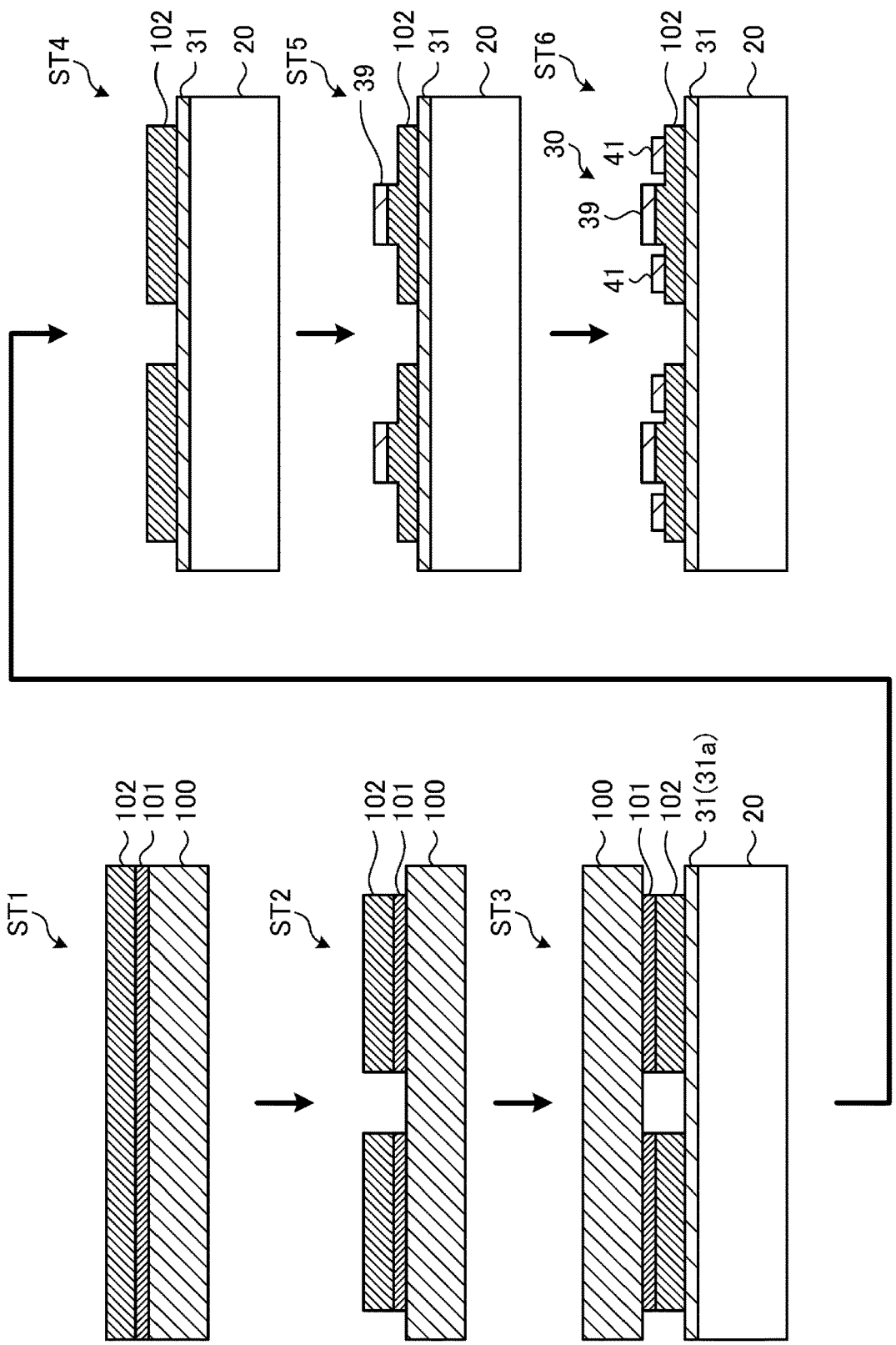
FIG. 3 is a view for illustrating a manufacturing method for a power amplifier.

FIG. 3 is a view for illustrating a manufacturing method for the power amplifier. As shown in FIG. 3, in the manufacturing method for the power amplifier, initially, a manufacturing apparatus causes a release layer 101 to be epitaxially grown on the motherboard 100 and forms an element formation layer 102 on the release layer 101 (step ST1). A monocrystal substrate made of a compound semiconductor, such as GaAs, is used as the motherboard 100. The sub-collector layer 38, the collector layer 37, the etching stop layer 36, the base layer 35, the emitter layer 34, the cap layer 33, and the contact layer 32, shown in FIG. 2, are laminated on the release layer 101 in this order in the element formation layer 102. In other words, the element formation layer 102 is formed in a multilayer structure in which part of each of the transistors 30 shown in FIG. 2 is inverted upside down. These element structures are formed by a general semiconductor process. In FIG. 3, element structures formed in the element formation layer 102 are not shown. At this stage, element structures corresponding to the plurality of transistors 30 are formed in the element formation layer 102 and are not separated into the individual transistors 30.

Subsequently, the element formation layer 102 and the release layer 101 are patterned by using a resist pattern (not shown) as an etching mask (step ST2). At this stage, the element formation layer 102 is separated into the transistors 30. In step ST2, the emitter layer 34, the cap layer 33, the contact layer 32, and the second portion 31b of the emitter electrode 31 are patterned, and the electrical insulators 45 are formed on the base layer 35.

Subsequently, the substrate 20 on which the first portion 31a of the emitter electrode 31 is provided is prepared, and the element formation layers 102 are bonded to the substrate 20 (step ST3). In this process, the surface of the motherboard 100, on which the element formation layers 102 are formed, is disposed so as to face the major surface of the substrate 20, on which the first portion 31a is provided. The first portion 31a provided on the substrate 20 and the second portion 31b provided on the element formation layer 102 are joined to each other. The electrical insulators 45 provided in the element formation layers 102 are in contact with the first portion 31a provided on the substrate 20.

Subsequently, the release layers 101 are selectively etched against the motherboard 100 and the element formation layers 102. Thus, the element formation layers 102 and the substrate 20 are released from the motherboard 100 (step ST4). To selectively etch the release layers 101, compound semiconductors having different etching resistances from any of the motherboard 100 and the element formation layers 102 are used as the release layers 101.

Subsequently, the collector electrode 39 is formed on the top surface side of the element formation layer 102, and the collector layer 37 and the sub-collector layer 38 are patterned (step ST5). At this time, the progress of etching of the base layer 35 in the non-overlap region is suppressed by the etching stop layer 36. Thus, the width of each of the collector layer 37, the sub-collector layer 38, and the collector electrode 39 in the second direction Dy is less than the width of the base layer 35 in the second direction Dy.

Subsequently, the manufacturing apparatus forms the base electrode 41 on the base layer 35 of each element formation layer 102 (step ST6). Furthermore, where necessary, an element electrically insulating film, the collector wire 40, the emitter wires 42, and the base wire 43 (see FIG. 6), the conductive protrusion 51 (see FIG. 6), or the like is formed. The power amplifier 10 including the plurality of transistors 30 is manufactured in accordance with the above-described processes.

The above-described configuration and manufacturing method for the power amplifier 10 are only one examples and may be modified as needed. For example, in the first embodiment, the power amplifier 10 includes the plurality of transistors 30. Alternatively, the power amplifier 10 may include one transistor 30. The first portion 31a and the second portion 31b are laminated in the emitter electrode 31; however, the configuration is not limited thereto. The emitter electrode 31 may be made up of only any one layer.

As described above, the power amplifier 10 of the first embodiment includes the substrate 20, and the emitter layer 34, the base layer 35, and the collector layer 37, laminated in this order on the major surface of the substrate 20, and includes the electrical insulators 45 provided adjacent to the emitter layer 34, the emitter electrode 31 provided between the substrate 20 and both the emitter layer 34 and the electrical insulators 45, the base electrode 41 electrically connected to the base layer 35, and the collector electrode 39 electrically connected to the collector layer 37. In the direction perpendicular to the major surface of the substrate 20, the electrical insulators 45 and the base layer 35 are provided between the emitter electrode 31 and the base electrode 41.

With this configuration, the base electrode 41 is provided on the surface of the base layer 35 on the same side as the collector layer 37. Therefore, in comparison with the configuration in which the base electrode 41 is formed on the surface of the base layer 35 on the same side as the emitter electrode 31, a base wire is easily formed, the distance from the emitter wire 42 increases, with the result that a parasitic capacitance formed between an emitter and a base is reduced. As a result, the power amplifier 10 is able to suppress a decrease in radio-frequency characteristics.

The base electrode 41 is provided on the surface of the base layer 35 on the same side as the collector layer 37, and the flexibility of the shape and the like of the base electrode 41 is increased. As a result, a break of a wire or the like can also be prevented. In other words, to reduce base resistance, even when the base electrode 41 is formed thick, a sufficient thickness for preventing a break or the like of a base lead wire connected from the base electrode 41 can be ensured.

Since the electrical insulators 45 are provided on the base layer 35 in the non-overlap region that does not overlap the emitter layer 34, high resistance can be provided between the base layer 35 and the emitter electrode 31 in the non-overlap region. In other words, due to the presence of the electrical insulators 45, a base-emitter junction area is almost equal to or less than a base-collector junction area. As a result, the power amplifier 10 improves an amplification rate.

The power amplifier 10 includes the substrate-side electrically insulating layer 21 provided between the major surface of the substrate 20 and the emitter electrode 31. With this configuration, the power amplifier 10 is able to reduce a leakage current between the substrate 20 and the emitter electrode 31 of the transistor 30 and a parasitic capacitance of the substrate 20.

In the power amplifier 10, the collector electrode 39 is provided on the same surface side as the surface of the base layer 35, on which the base electrode 41 is provided, and is disposed side by side with the base electrode 41 in plan view. With this configuration, the power amplifier 10 is able to suppress an increase in collector capacitance in comparison with the configuration in which the collector layer 37 and the collector electrode 39 are provided on the substrate 20 side.

In the power amplifier 10, the dielectric constant of the electrical insulators 45 is lower than the dielectric constant of the emitter layer 34. With this configuration, the electrical insulators 45 made of a low dielectric constant material are provided between the base electrode 41 and the emitter electrode 31, so a parasitic capacitance formed between the emitter and the base is reduced.

In the power amplifier 10, the thermal conductivity of the substrate 20 is made higher than the thermal conductivity of any of the emitter layer 34, the base layer 35, and the collector layer 37. With this configuration, heat conducted from the emitter electrode 31 of the transistor 30 to the substrate 20 is sufficiently diffused into the substrate 20 and efficiently dissipated.

In the power amplifier 10, the etching stop layer 36 is provided between the base layer 35 and the collector layer 37 in the direction perpendicular to the major surface of the substrate 20. With this configuration, the etching stop layer 36 is capable of suppressing the progress of etching of the base layer 35. Therefore, the collector layer 37 and the sub-collector layer 38 formed on the base layer 35 and the etching stop layer 36 can be patterned more favorably by etching. The film thickness of the etching stop layer 36 is 3 nm to 5 nm, and a tunnel effect occurs on electrons flowing through the collector layer 37, so a decrease in the characteristics of the power amplifier 10 is suppressed.

Modification of First Embodiment

Figure 4:
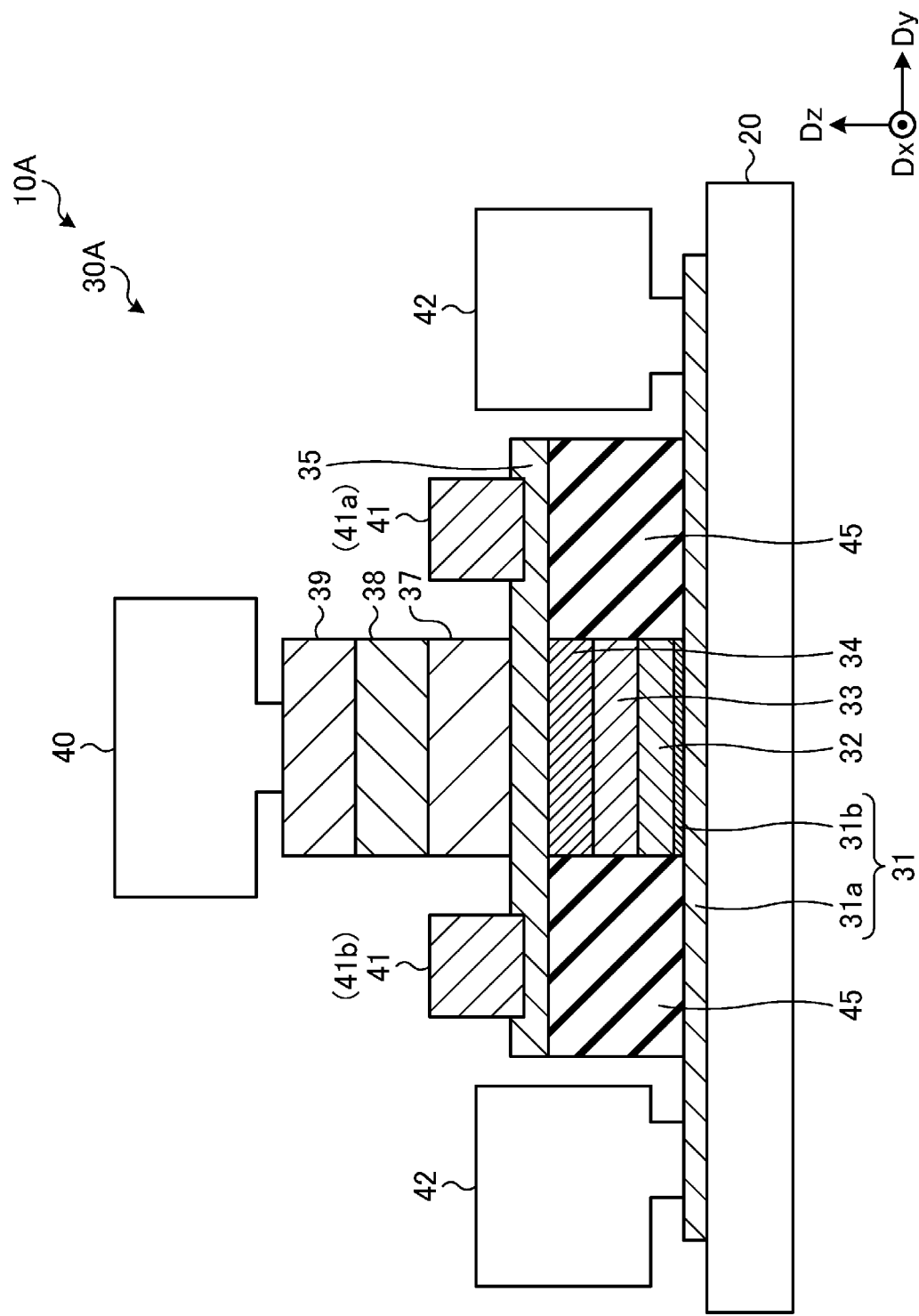
FIG. 4 is a cross-sectional view schematically showing a power amplifier according to a modification of the first embodiment.

FIG. 4 is a cross-sectional view schematically showing a power amplifier according to a modification of the first embodiment. In the following description, like reference signs are assigned to the same component elements to those of the above-described embodiment, and the description is omitted. As shown in FIG. 4, the power amplifier 10A according to the modification of the first embodiment differs from the above-described first embodiment in that the substrate-side electrically insulating layer 21 and the etching stop layer 36 are not provided.

In other words, the emitter electrode 31 (first portion 31a) is directly provided on the major surface of the substrate 20. In the modification of the first embodiment, the substrate-side electrically insulating layer 21 is not provided between the emitter electrode 31 and the substrate 20, so heat generated in a transistor 30A is favorably conducted from the emitter electrode 31 to the substrate 20. As a result, the power amplifier 10A improves heat dissipation characteristics.

The collector layer 37 is provided on the base layer 35 in the third direction Dz so as to be in direct contact with the base layer 35. In the modification of the first embodiment, a double heterojunction bipolar transistor (DHBT) is used in the power amplifier 10A. The base layer 35 is made of a material different from that of the collector layer 37. For example, InP is used as the material of the base layer 35. For example, InGaAs is used as the material of the collector layer 37. Thus, while the collector layer 37 and the sub-collector layer 38 are patterned by etching, the progress of etching of the non-overlap region of the base layer 35 is suppressed.

In the modification of the first embodiment, the configuration in which both the substrate-side electrically insulating layer 21 and the etching stop layer 36 are not provided has been described; however, the configuration is not limited thereto. The configuration may be, for example, a configuration in which the substrate-side electrically insulating layer 21 is provided and the etching stop layer 36 is not provided or a configuration in which the substrate-side electrically insulating layer 21 is not provided and the etching stop layer 36 is provided.

Second Embodiment

Figure 5:
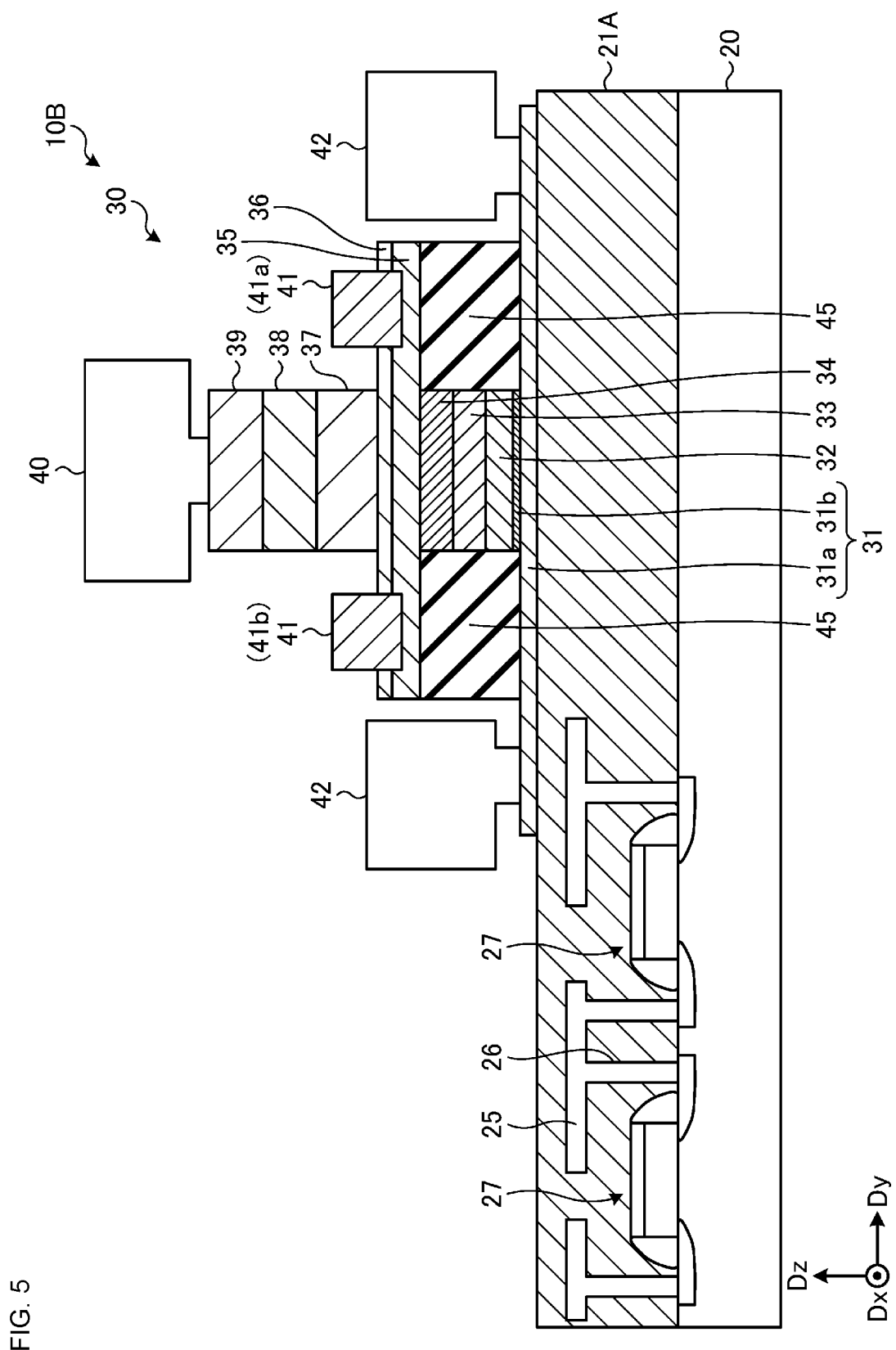
FIG. 5 is a cross-sectional view schematically showing a power amplifier according to a second embodiment.

FIG. 5 is a cross-sectional view schematically showing a power amplifier according to a second embodiment. In the second embodiment, different from the above-described first embodiment or the modification of the first embodiment, a configuration in which the power amplifier 10B includes at least one substrate-side transistor 27 formed on the major surface of the substrate 20 will be described.

The substrate-side transistor 27 is, for example, a silicon-based MOS transistor or a silicon-based bipolar transistor. The substrate-side transistor 27 may have a CMOS structure.

A multilayer wiring structure 21A is provided on the major surface of the substrate 20 over the substrate-side transistor 27. The multilayer wiring structure 21A includes a plurality of wires 25 and a plurality of vias 26. The substrate-side transistor 27 is electrically connected to at least one wire 25 and one via 26 of the multilayer wiring structure 21A.

In the second embodiment, an electronic circuit made up of the substrate-side transistor 27 provided on the major surface of the substrate 20 and an electronic circuit made up of semiconductor elements such as the transistor 30 provided on the multilayer wiring structure 21A are electrically connected via the multilayer wiring structure 21A. Therefore, a compound semiconductor-based semiconductor element and an elemental semiconductor-based (silicon-based) semiconductor element can be connected to the power amplifier 10B without intervening a module substrate or the like. Thus, the size of the power amplifier 10B is reduced. A power amplifier including a compound semiconductor-based semiconductor element and an elemental semiconductor-based (silicon-based) semiconductor element, other passive components, and other active components are disposed on a module substrate. The module substrate makes up a radio-frequency module and is implemented on a mother board.

The substrate-side transistor 27 and the transistor 30 formed on the multilayer wiring structure 21A may have different configurations. For example, the second embodiment may be combined with the transistor 30A of the above-described modification of the first embodiment.

Third Embodiment

Figure 6:
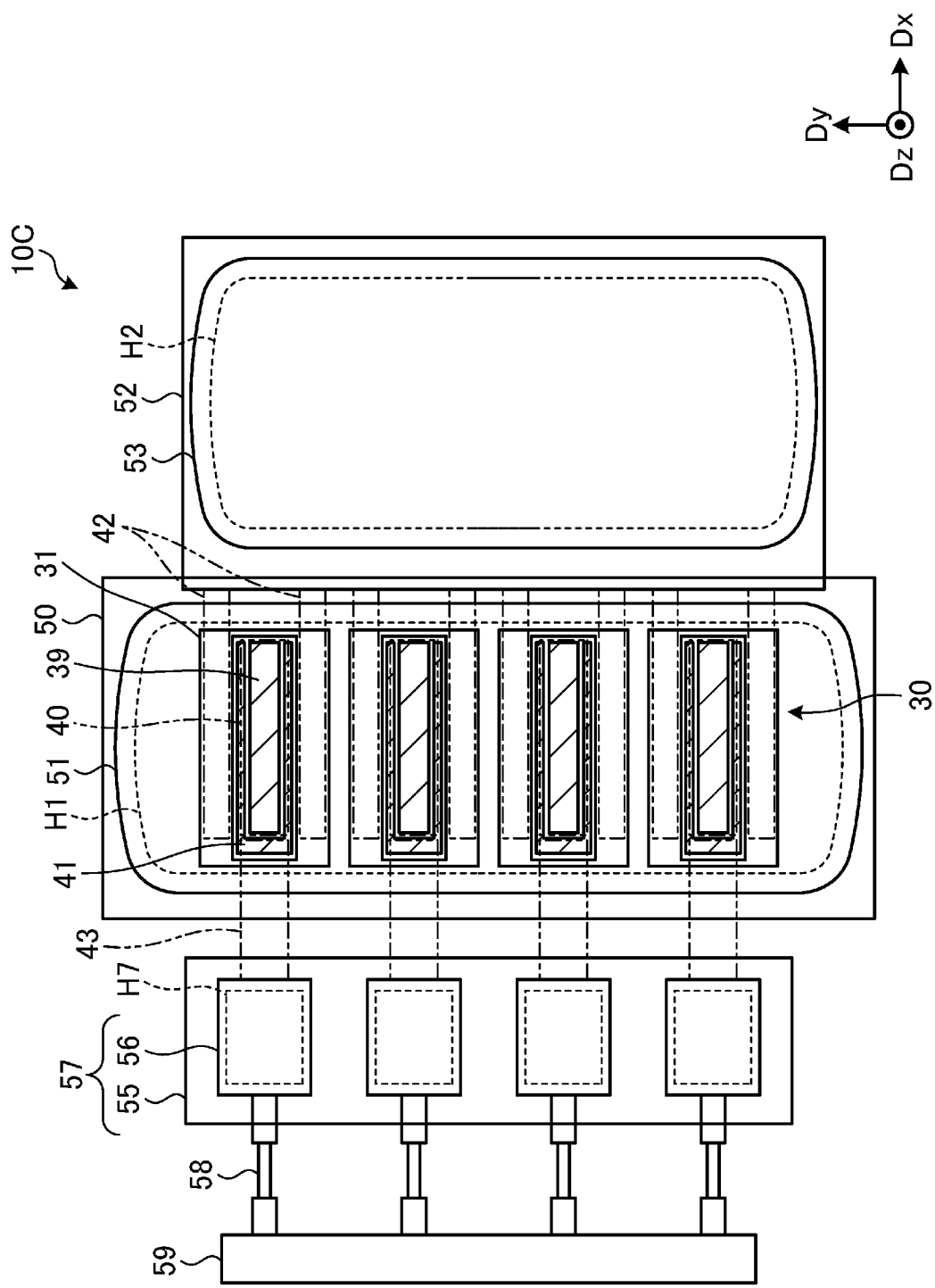
FIG. 6 is a plan view schematically showing a power amplifier according to a third embodiment.

FIG. 6 is a plan view schematically showing a power amplifier according to a third embodiment. In the third embodiment, different from the above-described first embodiment, the second embodiment, or the modification of the first embodiment, a configuration in which the power amplifier 10C includes a capacitive element 57 and a resistive element 58 will be described.

As shown in FIG. 6, the capacitive element 57 and the resistive element 58 are connected to each of the plurality of transistors 30. The power amplifier 10C further includes an RF input wire 55 and a bias input wire 59. The RF input wire 55 and the bias input wire 59 each extend in the second direction Dy and are arranged side by side in the first direction Dx. The RF input wire 55 is a wire that supplies a radio-frequency input signal to the base of each of the transistors 30. The bias input wire 59 is a wire that supplies a base bias signal (direct-current voltage signal) to the base of each of the transistors 30.

A plurality of the resistive elements 58 is connected in parallel with the bias input wire 59. One end side of each resistive element 58 is connected to the bias input wire 59, and the other end side of each resistive element 58 is connected to a counter electrode 56. The counter electrode 56 is disposed so as to face the RF input wire 55. The capacitive element 57 is made up of parts of the RF input wire 55 and the counter electrodes 56, disposed so as to face each other. The RF input wire 55 common to the plurality of transistors 30 is provided, and the plurality of counter electrodes 56 is provided respectively for the plurality of transistors 30. The counter electrode 56 is electrically connected to the base electrode 41 of each transistor via the base wire 43 and a contact hole H6 (see FIG. 7).

The power amplifier 10C further includes a collector lead wire 50, an emitter lead wire 52, and conductive protrusions 51, 53. The collector lead wire 50 extends in the second direction Dy over the plurality of transistors 30. The collector lead wire 50 is connected to the collector wires 40 of the plurality of transistors 30. The conductive protrusion 51 overlaps the collector lead wire 50 and is connected to the collector lead wire 50 via a contact hole H1.

The emitter lead wire 52 is disposed side by side with the plurality of transistors 30 in the first direction Dx and extends in the second direction Dy. The emitter lead wire 52 is connected to the emitter wires 42 of the plurality of transistors 30. The conductive protrusion 53 overlaps the emitter lead wire 52 and is connected to the emitter lead wire 52 via a contact hole H2. A structure that the conductive protrusions 51, 53 are made of Cu and solder is placed on the conductive protrusions 51, 53 is referred to as "Cu pillar bump". The one having a structure that no solder is placed on the top surface as in the case of Au bump may be used as the conductive protrusions 51, 53. A protrusion with such a structure is also referred to as "pillar". The one having a structure that a conductive pillar is upright on a pad may be adopted as the conductive protrusions 51, 53. A conductive protrusion with such a structure is also referred to as "post". A ball bump formed by reflowing solder into a ball shape may be used as the conductive protrusions 51, 53. Other than the one having these various structures, the one having various structures including a conductor protruded from the substrate may be used as the conductive protrusions 51, 53.

Figure 7:
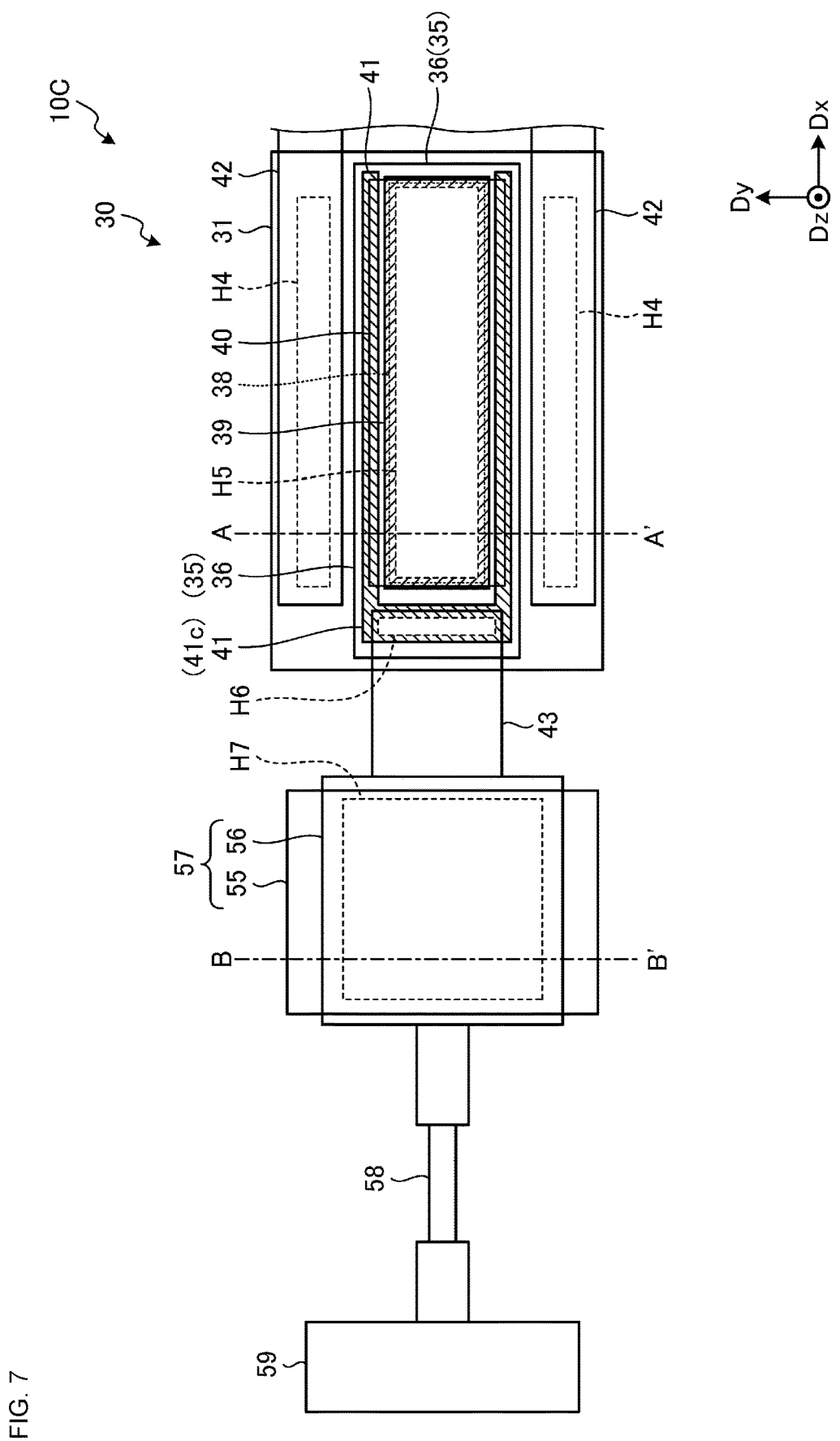
FIG. 7 is an enlarged plan view of one of transistors shown in FIG. 6, and one capacitive element and one resistive element connected to the transistor.
Figure 8:
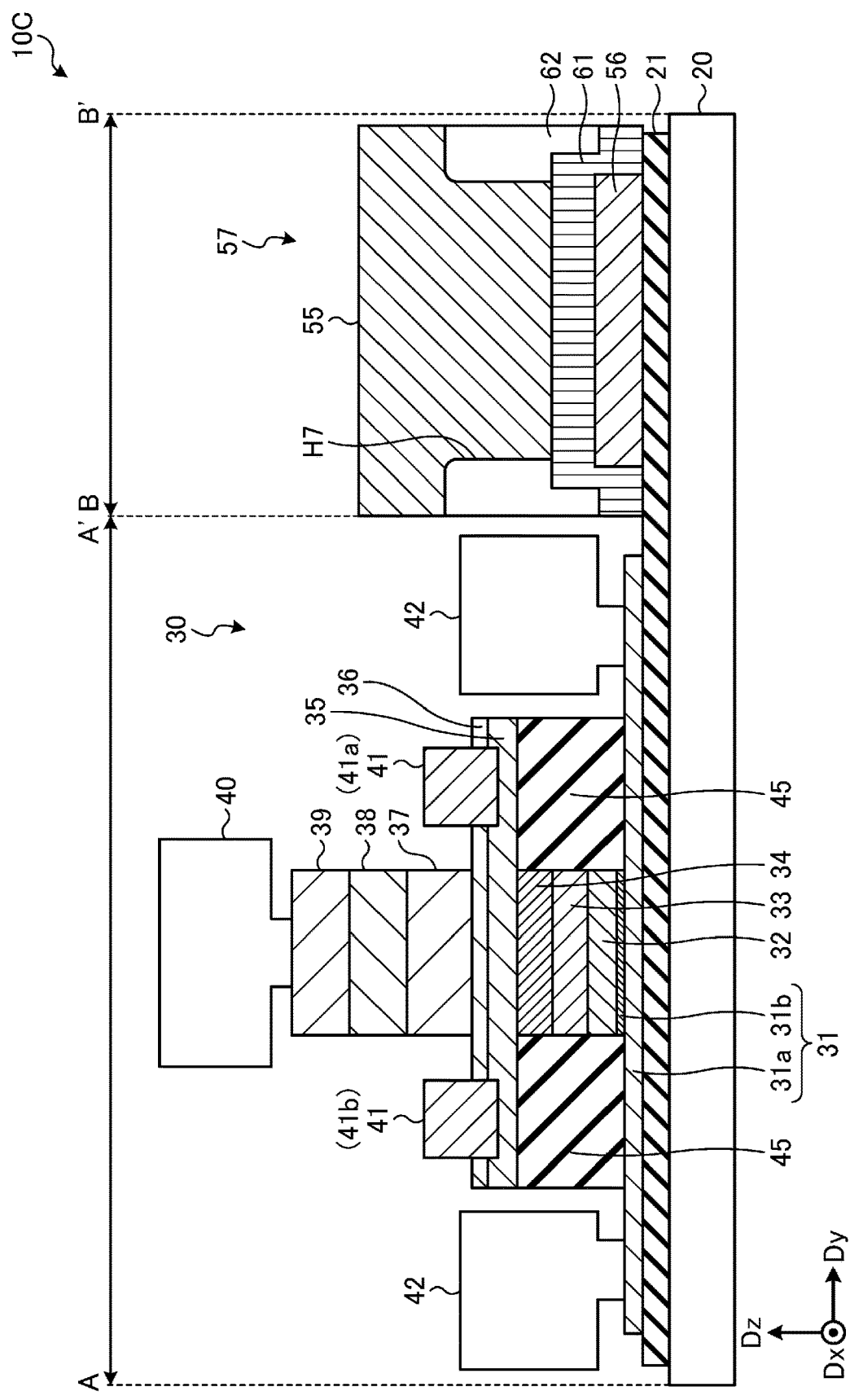
FIG. 8 is a cross-sectional view taken along the line A-A' and the line B-B' in FIG. 7.

FIG. 7 is an enlarged plan view of one of the transistors shown in FIG. 6, and one capacitive element and one resistive element connected to the transistor. FIG. 8 is a cross-sectional view taken along the line A-A' and the line B-B' in FIG. 7. As shown in FIG. 7, the base wire 43 extends in the first direction Dx. One end side of the base wire 43 is connected to the counter electrode 56, and the other end side of the base wire 43 is connected to the connection portion 41c of the base electrode 41 via the contact hole H6 provided in an electrically insulating layer (not shown) covering the transistor 30.

The collector wire 40 is provided so as to overlap the collector electrode 39 and extends in the first direction Dx. The collector wire 40 is connected to the collector electrode 39 via a contact hole H5 provided in the electrically insulating layer (not shown) covering the transistor 30.

The emitter wires 42 are provided so as to overlap a region in which the base layer 35 is not provided on the emitter electrode 31 and extends in the first direction Dx. The emitter wires 42 are connected to the emitter electrode 31 via contact holes H4 provided in an electrically insulating layer (not shown) covering the transistor 30. In the present embodiment, two emitter wires 42 are provided side by side in the second direction Dy in plan view. The collector wire 40 is disposed between the two emitter wires 42.

As shown in FIG. 8, the capacitive element 57 is formed on the substrate 20. In other words, the capacitive element 57 and the transistor 30 are formed on the same substrate 20. The counter electrode 56, electrically insulating layers 61, 62, and the RF input wire 55 are laminated in this order on the substrate-side electrically insulating layer 21. A contact hole H7 is provided in the electrically insulating layer 62, and the RF input wire 55 is also provided inside the contact hole H7. The RF input wire 55 faces the counter electrode 56 via the electrically insulating layer 61 at the bottom portion of the contact hole H7. With such a configuration, the capacitive element 57 is formed.

Although not shown in FIG. 8, the resistive element 58 and the bias input wire 59 (see FIG. 6 and FIG. 7) are also formed on the substrate 20. The resistive element 58 and the bias input wire 59 may be provided in the same layer as the counter electrode 56 or may be provided in the same layer as the RF input wire 55. Alternatively, the resistive element 58 and the bias input wire 59 may use a layer different from the capacitive element 57.

In the third embodiment, the plurality of transistors 30, the plurality of capacitive elements 57, the plurality of resistive elements 58, and various wires are provided on the major surface of the same substrate 20. In other words, the power amplifier 10C is formed as an amplifier circuit such that a plurality of circuit elements including the plurality of transistors 30 is integrated onto the same substrate 20. Therefore, the power amplifier 10C allows a reduction in size as compared to a configuration in which elements are formed on different substrates.

Modification of Third Embodiment

Figure 9:
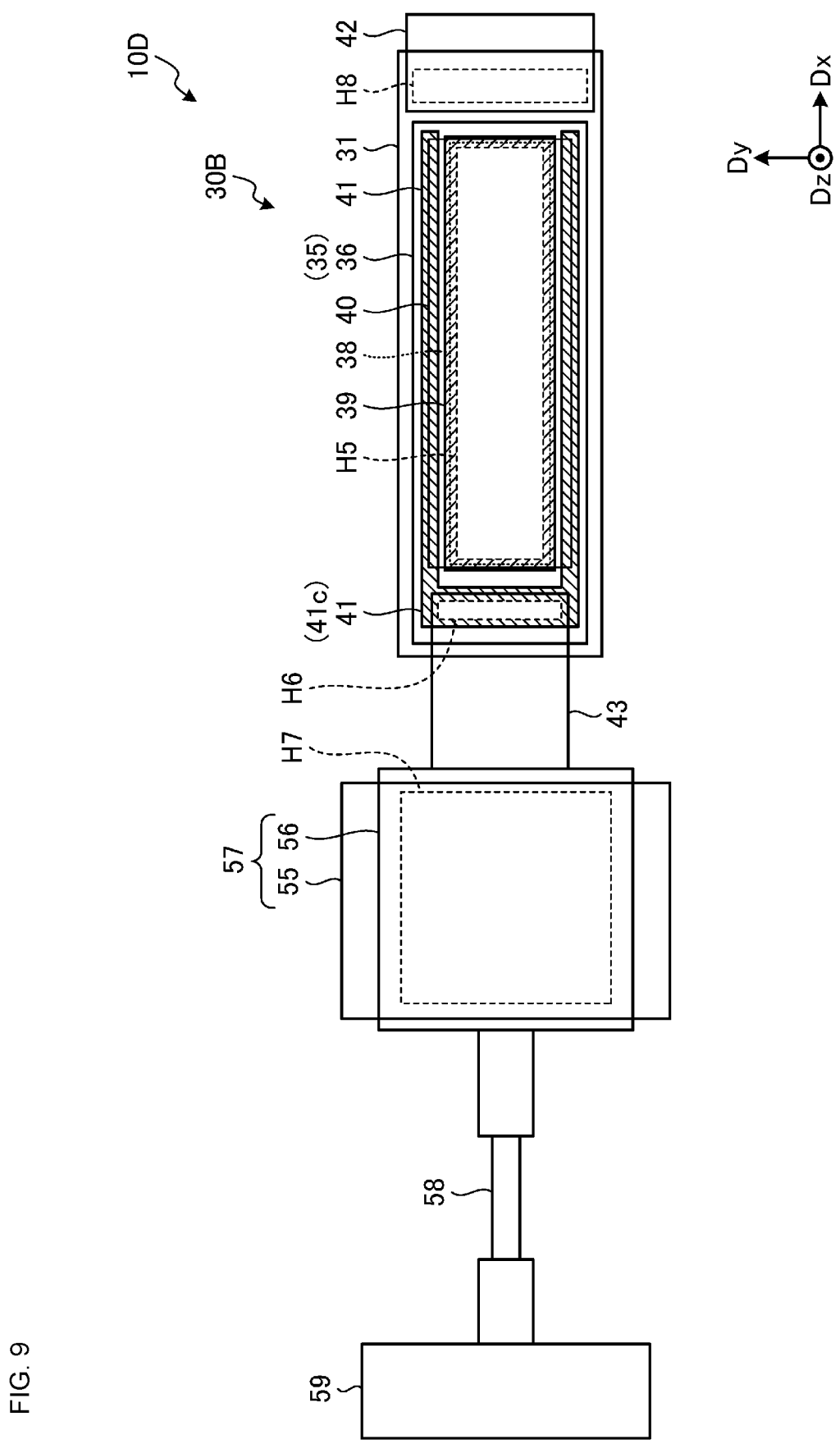
FIG. 9 is an enlarged plan view of one transistor, one capacitive element connected to the transistor, and one resistive element according to a modification of the third embodiment.

FIG. 9 is an enlarged plan view of one transistor according to a modification of the third embodiment, and one capacitive element and one resistive element connected to the transistor. In the modification of the third embodiment, different from the above-described embodiments or the modification of the first embodiment, a configuration that one emitter wire 42 is connected to the transistor 30 will be described.

As shown in FIG. 9, the width of the emitter electrode 31 in the first direction Dx is greater than the width of the base layer 35 in the first direction Dx. The emitter wire 42 is provided side by side with the base layer 35, the base electrode 41, and the collector wire 40 in the first direction Dx in plan view. One end side of the emitter wire 42 is connected to the emitter electrode 31 via a contact hole H8 provided in an electrically insulating layer (not shown) covering the transistor 30B.

In the present modification, the base wire 43, the collector wire 40, and the emitter wire 42 extend in the first direction Dx and are disposed in a straight line. With this configuration, the size of the transistor 30B in the second direction Dy can be reduced. With a multicell-structure power amplifier 10D in which the plurality of transistors 30B is arranged in the second direction Dy, the arrangement pitch of the plurality of transistors 30B can be reduced, so the size in the second direction Dy can be reduced.

Fourth Embodiment

Figure 10:
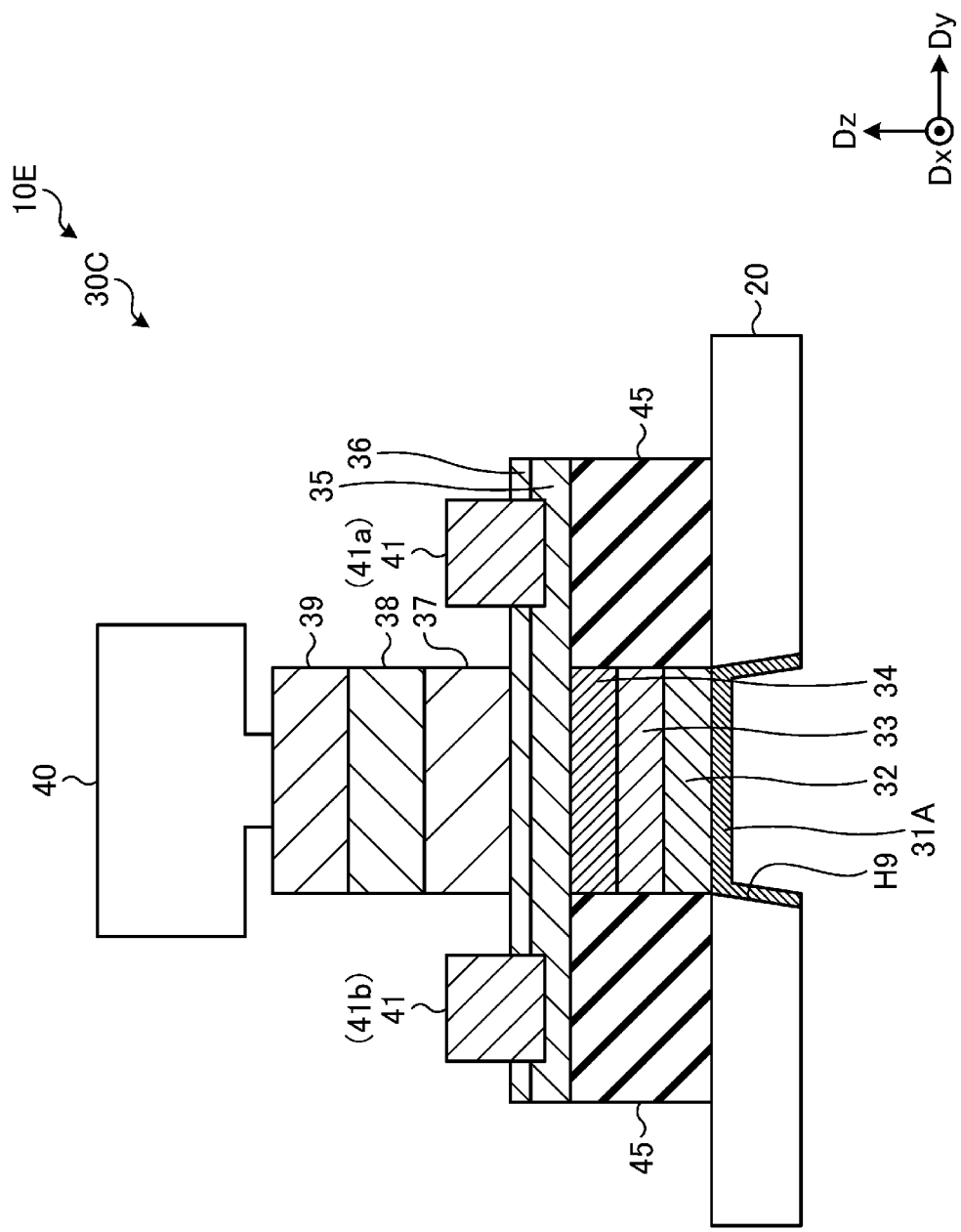
FIG. 10 is a cross-sectional view schematically showing a power amplifier according to a fourth embodiment.

FIG. 10 is a cross-sectional view schematically showing a power amplifier according to a fourth embodiment. In the power amplifier 10E of the fourth embodiment, different from the above-described embodiments or the modifications, a configuration in which an emitter electrode 31A is not provided on the major surface of the substrate 20 will be described.

Specifically, a transistor 30C is directly provided on the major surface of the substrate 20. In the fourth embodiment, the substrate-side electrically insulating layer 21 and the first portion 31a (see FIG. 2) are not provided on the major surface of the substrate 20. A through-hole H9 is provided in a region of the substrate 20, which overlaps the contact layer 32, the cap layer 33, and the emitter layer 34. In other words, the contact layer 32 is provided over a major surface-side opening of the through-hole H9. The emitter electrode 31A is provided on the inner wall of the through-hole H9 and is in contact with the bottom surface of the contact layer 32. With this configuration, the emitter electrode 31A is electrically connected to the emitter layer 34 via the through-hole H9, the contact layer 32, and the cap layer 33.

The electrical insulators 45 of the transistor 30C are provided so as to be in direct contact with the major surface of the substrate 20 in a region that does not overlap the through-hole H9. The electrical insulators 45 are provided between the major surface of the substrate 20 and the base layer 35 in the third direction Dz. The electrical insulators 45 are provided adjacent to the contact layer 32, the cap layer 33, and the emitter layer 34. The electrical insulators 45 are not adjacent to part (second portion 31b (see FIG. 2)) of the emitter electrode 31A.

The emitter electrode 31A can be formed by a thin-film method, such as vapor deposition, from the back surface side of the substrate 20 after the transistor 30C formed on the motherboard 100 (see FIG. 3) is bonded to the substrate 20. A method of forming the emitter electrode 31A is not limited to vapor deposition and may be another method, such as a printing method.

In the present embodiment, the emitter electrode 31A is provided in a region that overlaps the emitter layer 34. In other words, the first portion 31a (see FIG. 2) that faces the non-overlap region of the base layer 35 is not provided. Therefore, with the transistor 30C of the power amplifier 10E of the fourth embodiment, a parasitic capacitance between the base and the emitter is reduced as compared to the above-described embodiments.

Figure 11:
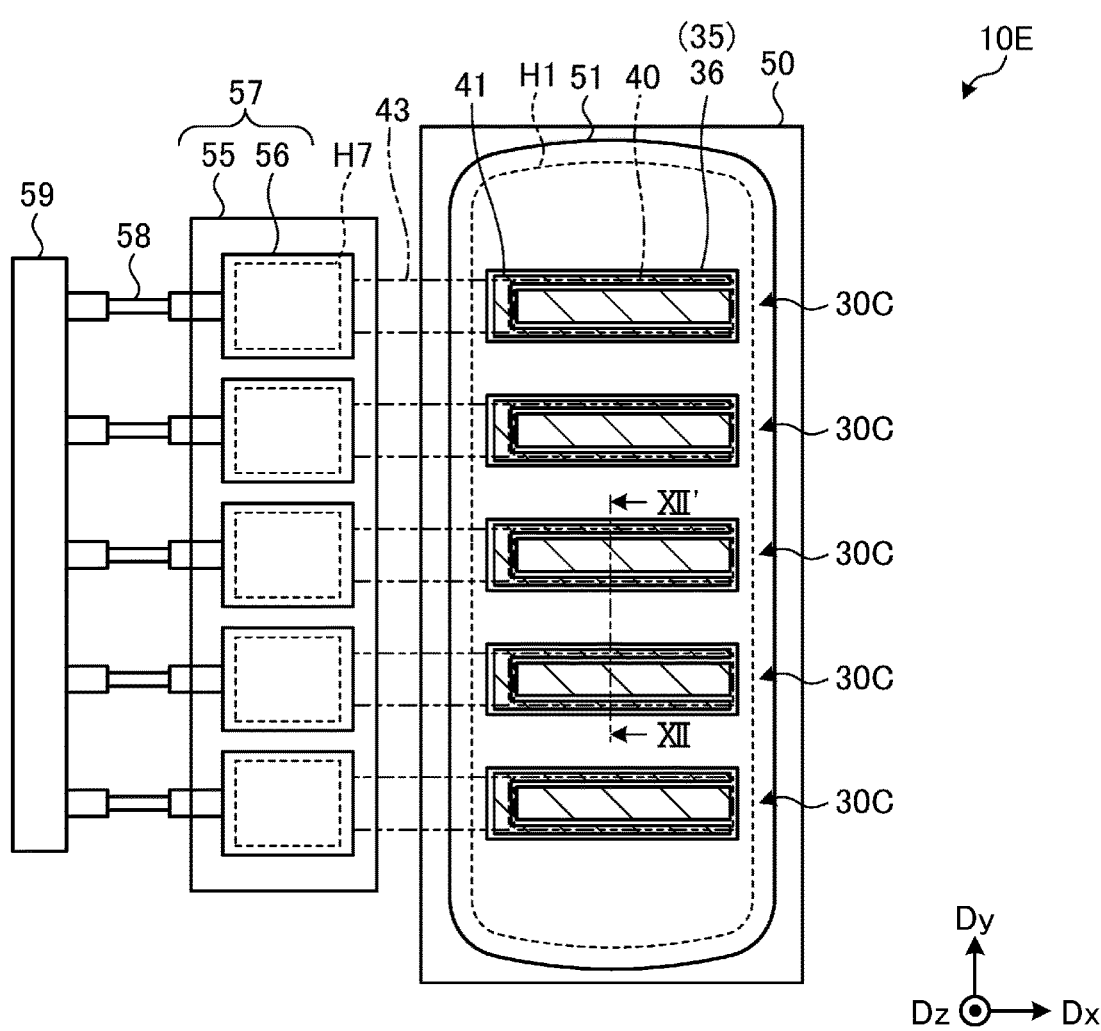
FIG. 11 is a plan view schematically showing a power amplifier according to the fourth embodiment.
Figure 12:
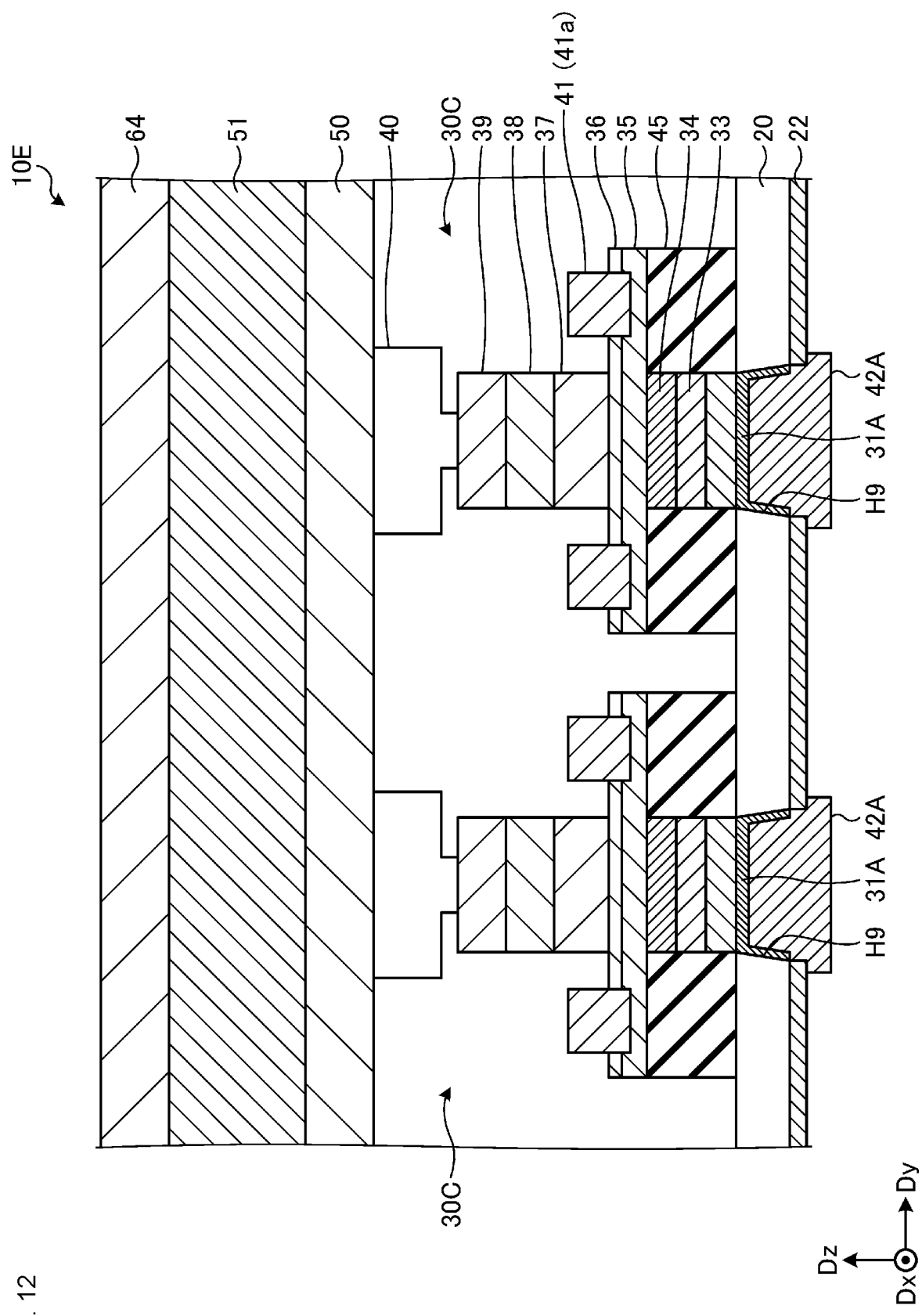
FIG. 12 is a cross-sectional view taken along the line XII-XII' in FIG. 11.

FIG. 11 is a plan view schematically showing a power amplifier according to the fourth embodiment. FIG. 12 is a cross-sectional view taken along the line XII-XII' in FIG. 11. As shown in FIG. 11 and FIG. 12, each of the emitter wires 42A is formed on the back surface side of the substrate 20 over the emitter electrode 31A and the through-hole H9. As shown in FIG. 11, the emitter electrode 31A and the emitter wire 42A are not provided on the major surface side of the substrate 20. Therefore, the width of the transistor 30C in the second direction Dy in plan view is defined by the width of the base layer 35 in the second direction Dy. With such a configuration, with the multicell-structure power amplifier 10E in which the plurality of transistors 30C is arranged in the second direction Dy, the arrangement pitch of the plurality of transistors 30C can be reduced, so the size in the second direction Dy can be reduced.

As shown in FIG. 12, the collector lead wire 50 and the conductive protrusion 51 are laminated on the plurality of collector wires 40. Solder 64 is provided on the conductive protrusion 51.

The width of the major surface-side opening of the through-hole H9 is formed in the same size as the width of the contact layer 32. However, the configuration is not limited thereto. The major surface-side opening of the through-hole H9 may be different from the width of the contact layer 32. In FIG. 12, a substrate back surface-side electrically insulating layer 22 is provided on the back surface of the substrate 20. However, the substrate back surface-side electrically insulating layer 22 does not need to be provided.

Fifth Embodiment

Figure 13:
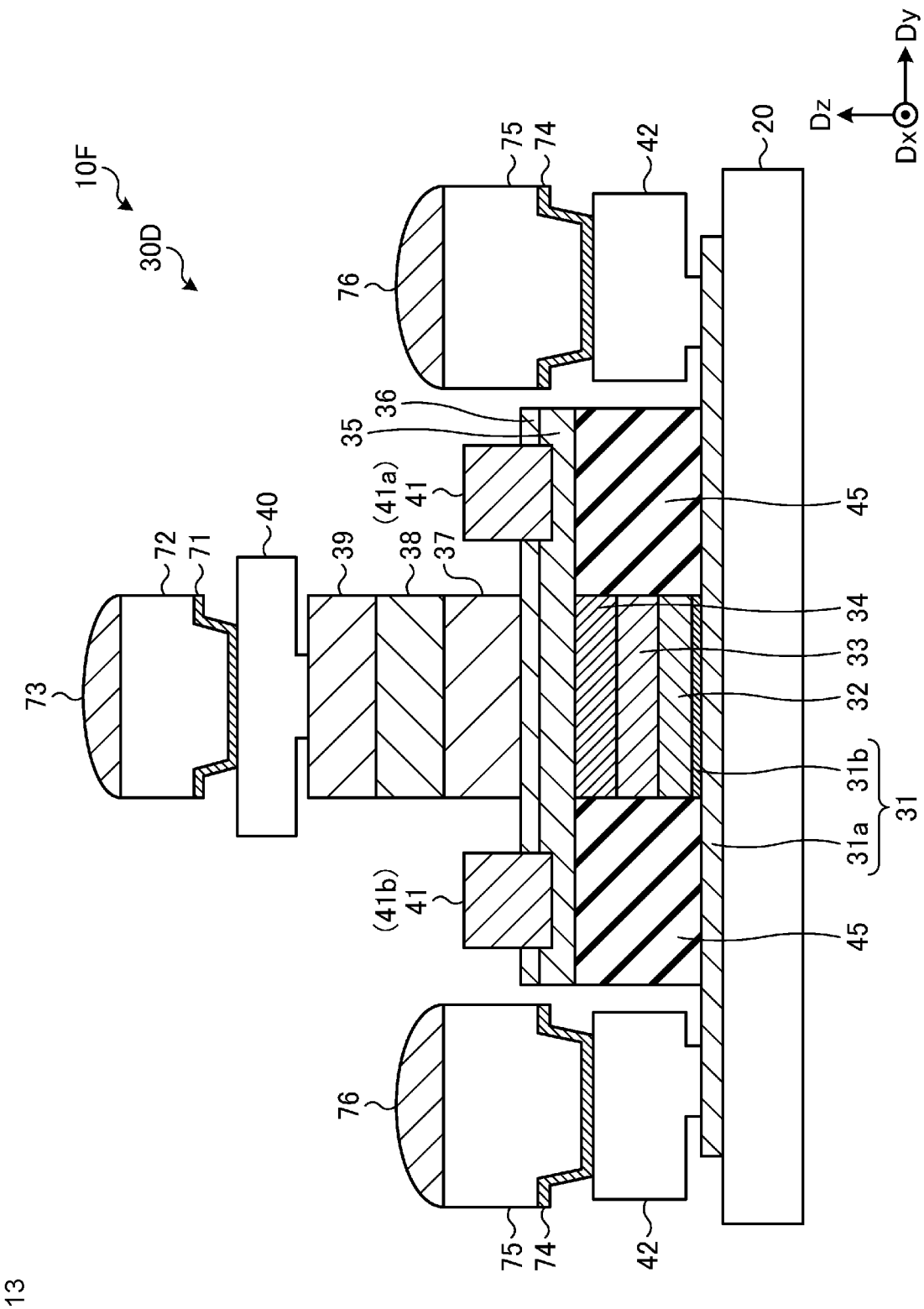
FIG. 13 is a cross-sectional view schematically showing a power amplifier according to a fifth embodiment.

FIG. 13 is a cross-sectional view schematically showing a power amplifier according to a fifth embodiment. In the power amplifier 10F of the fifth embodiment, different from the above-described embodiments or the modifications, a configuration in which conductive protrusions 72, 75 are provided directly on the upper sides of the collector wire 40 and the emitter wires 42 will be described.

As shown in FIG. 13, an underlying metal layer 71, the conductive protrusion 72, and solder 73 are provided in this order on the collector wire 40 connected to the collector electrode 39. An underlying metal layer 74, the conductive protrusion 75, and solder 76 are provided in this order on each of the emitter wires 42 connected to the emitter electrode 31.

The conductive protrusions 72, 75 are, for example, Cu pillar bumps and are formed by an electric field plating method. However, the conductive protrusions 72, 75 may be, for example, solder bumps or stud bumps or may be made of another metal material, such as Au. The underlying metal layers 71, 74 are plating electrodes used at the time of forming the conductive protrusions 72, 75.

In the present embodiment, since the conductive protrusions 72, 75 are provided, the top surface-side heat dissipation characteristics of the transistor 30D are improved. Since the conductive protrusions 72, 75 are provided directly on the collector wire 40 and the emitter wires 42 and the collector lead wire 50 and the emitter lead wire 52 (see FIG. 6) are not provided, a multilayer structure is simplified.

The embodiments described above are intended to easily understand the present disclosure, and are not intended to limit interpretation of the present disclosure. The present disclosure may be modified or improved without departing from the purport of the present disclosure, and the present disclosure also encompasses equivalents thereof.

What is claimed is:

1. A power amplifier that includes a substrate, and an emitter layer, a base layer, and a collector layer laminated in this order on a major surface of the substrate, the power amplifier comprising:
    an electrical insulator adjacent to the emitter layer;
    an emitter electrode between the substrate and both the emitter layer and the electrical insulator;
    a base electrode electrically connected to the base layer;
    a collector electrode electrically connected to the collector layer; and
    an etching stop layer separating the base layer from the collector layer in a direction perpendicular to the major surface of the substrate, wherein
    the base electrode overlaps the emitter electrode, the electrical insulator, the base layer, and the substrate in the direction perpendicular to the major surface of the substrate,
    the base electrode is electrically connected to the base layer by passing through the etching stop layer separating the base layer from the collector layer,
    the base electrode further comprises two main portions extending in a first direction parallel to the major surface of the substrate and a connection portion connecting the two main portions by extending in a second direction parallel to the major surface of the substrate and perpendicular to the first direction, and
    the base electrode comprising the two main portions and the connection portion being surrounded by the etching stop layer and separated from the collector layer by the etching stop layer.

2. The power amplifier according to claim 1, further comprising:
    a substrate-side electrically insulating layer between the major surface of the substrate and the emitter electrode.

3. The power amplifier according to claim 2, wherein
    the collector electrode is on a same surface side as a surface of the base layer on which the base electrode is disposed, and disposed side by side with the base electrode in plan view.

4. The power amplifier according to claim 2, wherein
    a dielectric constant of the electrical insulator is lower than a dielectric constant of the emitter layer.

5. The power amplifier according to claim 2, wherein
    a thermal conductivity of the substrate is higher than a thermal conductivity of any of the emitter layer, the base layer, and the collector layer.

6. The power amplifier according to claim 1, wherein
    the collector electrode is on a same surface side as a surface of the base layer on which the base electrode is disposed, and disposed side by side with the base electrode in plan view.

7. The power amplifier according to claim 1, wherein
    a dielectric constant of the electrical insulator is lower than a dielectric constant of the emitter layer.

8. The power amplifier according to claim 1, wherein
    a thermal conductivity of the substrate is higher than a thermal conductivity of any of the emitter layer, the base layer, and the collector layer.

9. The power amplifier according to claim 1, wherein the electrical insulator is positioned adjacent to a side of the base layer facing the emitter electrode in the direction.

* * * * *